(12) United States Patent
Douriet et al.

(10) Patent No.: US 8,055,486 B2
(45) Date of Patent: *Nov. 8, 2011

(54) POWER DELIVERY ANALYSIS AND DESIGN

(75) Inventors: Daniel Douriet, Round Rock, TX (US);
Anand Haridass, Austin, TX (US);
Andreas Huber, Austin, TX (US); Colm B. O'Reilly, Austin, TX (US); Bao Gia-Harvey Truong, Austin, TX (US);
Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 571 days.

This patent is subject to a terminal disclaimer.

(21) Appl. No.: 12/187,164

(22) Filed: Aug. 6, 2008

(65) Prior Publication Data
US 2008/0294414 A1 Nov. 27, 2008

(51) Int. Cl.
*G06F 17/50* (2006.01)
(52) U.S. Cl. .................. 703/2; 703/14; 716/4; 716/129
(58) Field of Classification Search .............. 703/2, 14;
716/129, 4
See application file for complete search history.

(56) References Cited

U.S. PATENT DOCUMENTS 6,851,094 B1* 2/2005 Robertson et al. ............ 716/129
7,269,541 B1* 9/2007 McGaughy et al. ............ 703/14
2003/0216901 A1* 11/2003 Schaumont et al. ............ 703/13

* cited by examiner

*Primary Examiner* — Thai Phan
(74) *Attorney, Agent, or Firm* — Cantor Colburn LLP; Matthew Talpis

(57) ABSTRACT

A computer program product is provided for power delivery analysis and design for a hierarchical system. The product includes a storage medium, readable by a processing circuit, for storing instructions for execution by the processing circuit for facilitating a method. The method includes building a model corresponding to each element of the hierarchical system, and compiling a repository that contains models corresponding to each element, where the repository includes a net list, a domain list, a component list, a pin list, and a layer list. The method also includes performing optimized gridding for each element, the net list, the domain list, the component list, the pin list, and the layer list; assembling a system model from the models contained in the repository; flattening the system model by converting the system model to a flattened system model that consists entirely of resistors; and running a simulation on the flattened system model.

8 Claims, 3 Drawing Sheets

HAL - Repository Structure

OS> create_repository.pl boardfile repository-directory-name

102 → -DESIGN.netlist (report from Design-file)
  pinnames and netnames in all subsequent files must be consistent
  pinnames are in the form REFDES.PIN
  netnames are either with or without quotes. The quotes do not belong to the netname 104 → -DESIGN. domainlist
  Includes all domains (name of the net) that have an valid DESIGN.AI and DESIGN.pinname2id
  The domainnames are given between quotes
  ## This is a comment line, currently it errors, but will be solved 106 → -DESIGN.pinlist (report from Design-file)
108 → -DESIGNcomponentlist (report from Design-file)
110 → -DESIGN.layerlist (extract from Design-file)

-vcon- and vassign-files are created for alls refdes in the netlist with more than two pins
  (Inside these files the pins are written without the leading refdes)
  refdes.vcon: ##pin   x[nm]        y[nm]      dx[nm]   dy[nm]   R[Ohm]
              A10    14500000   -23500000   0        0        0.020
  refdes.vassign.GND / refdes.vassign.100mA:
                                         I[mA]     R [Ohm]
  refdes.vassign / refdes.vassign.GND / refdes.vassign.100mA:
  ##pin    net                                                    I[mA]   R [Ohm]
  A10     #V_CPLOGIC_1P10                                         0.0     open -DOMAIN/DESIGN.al, DOMAIN/DESIGN.pin2node, DOMAIN/DESIGN.pinname2id
  For each domain DOMAIN a new subfolder is created.
  Domain names must not contain '\', '/' ot '.'.
  Domain names can contain special characters as '#'.

18.11.2005                    HAL42 - ah.de -dd.us                    3

```
MODULE.definition
$description ($bid | $mem)
  $design-name ahciliz      ##design basename without extension
  $repository-path ./LIB/AHCILIZ_10_12/REPOSITORY
$connectivity
  REFDES_ a-> CON.vcon(R=0.01)* DESCRIPTION_child REFDES_child NAME_connection
  REFDES_ b-> CON.vcon(R=0.01)* DESCRIPTION_child REFDES_child NAME_connection
  REFDES_ c-> CON.vcon(R=0.01)* DESCRIPTION_child REFDES_child NAME_connection
$termination
  REFDES_  -> CON.vcon(R=0.01)* TERMINATION_vassign (R=.02)* NAME_connection
*: if vcon-file or vassign-file does not specify a explicit path, it looks for the files in the $library-path
  R=10m, R=5K allowed
```

200

NAME_current (needs to generate own pinname2id file)

NAME
NAME.alsim
NAME.pinname2id
REFDES

Nodes:
NAME.n
18.11.2005         HAL42 -ah.de-dd.us

NAME_child
MODULE

NAME_NAME_child
NAME.NAME_chil.al.alsim
NAME.NAME.child.pinname2id
REFDES_child    MODULE_child Nodes:
NAME.NAME_child.n

4

POWER DELIVERY ANALYSIS AND DESIGN

CROSS-REFERENCE TO RELATED APPLICATIONS

This application contains subject matter which is related to the subject matter of the following co-pending applications, each of which is assigned to the same assignee as this application, International Business Machines Corporation of Armonk, N.Y., wherein each of the below listed applications is hereby incorporated herein by reference in its entirety: The present application is based on U.S. patent application Ser. No. 11/380,058 filed on Apr. 25, 2006 which is now U.S. Pat. No. 7,460,986 and priority therefrom is claimed under 35 U.S.C. §120.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND

1. Field of the Invention

The present invention relates in general to a power delivery analysis system and in particular to a power delivery analysis system for server designs consisting of several packaging hierarchies.

2. Description of Background

It is often desirable in the microelectronics industry to be able to implement physical solutions in as little time as possible for coping with new market opportunities and/or emerging problems. Computer-provided simulations are often used to predict the behaviors of to-be-manufactured electrical circuits or other like systems. This is preferably done before the electrical circuits are finalized so that design errors may be corrected and design parameters may be optimized prior mass production.

Computers and software simulators can be used for obtaining fairly accurate predictions of the analog behaviors of linear circuitry. Other examples of analog-behavior simulators include HSPICE® (available from Avant! Corp. California), SPICE-3® (available from Berkeley University of California), SPECTRE® (available from Cadence Corp. of California), ACES® (Adaptively Controlled Engine Simulator), and ITA® (Interactive Timing Analysis engine). These simulators and/or simulation engines are not to be confused with digital-behavior simulators such as VHDL which predict behavior of gate-level and lower-resolution hardware descriptions (e.g., register transfer level) in the digital realm rather than at the finer resolution of transistor-level signals and in the analog realm.

SPICE-like simulations can provide fairly accurate predictions of how corresponding circuits will behave when actually built. The predictions are preferably made not only for individual sub-circuits but also for whole systems (e.g., whole integrated circuits) so that system wide problems relating to noise and the like can be uncovered and dealt with.

However, simulation of whole systems becomes more difficult and problematic as the industry continues its relentless trek of scaling down to smaller and smaller device geometries as is predicted by Moore Law and of cramming more interconnected components into a system. An example of such down scaling is the recent shift from micron-sized channels toward deep submicron sized transistor lengths. Because of this, circuit designers are able to cram exponentially larger numbers of basic components or 'elements' (e.g., transistors, diodes, capacitors) into a given integrated circuit (IC) or other such, mass-producible device.

Due to the shortened time-to-market pressures in the industry, the designers of these mass-producible systems (e.g., IC's) want the makers of pre-fabrication SPICE-like simulators to come up with new ways for quickly and accurately predicting the system-wide behaviors of these exponentially more dense and more complex, interconnected system designs.

Accordingly what is needed is a method of providing end users with the capability under one system of performing fully flattened model simulations.

SUMMARY

Exemplary embodiments include a method of power delivery analysis and design for a hierarchical system including building a model corresponding to each element of the hierarchical system, compiling a repository that contains the models corresponding to each element of the hierarchical system, assembling a system model from the models contained in the repository, flattening the system model, and running a simulation on the flattened system model.

Exemplary embodiments also include a computer program product for power delivery analysis and design for a hierarchical system, the computer program product including a storage medium readable by a processing circuit and storing instructions for execution by the processing circuit for facilitating a method including: building a model corresponding to each element of the hierarchical system; compiling a repository that contains the models corresponding to each element of the hierarchical system; assembling a system model from the models contained in the repository; flattening the system model; and running a simulation on the flattened system model.

Further exemplary embodiments include a method of power delivery analysis and design for a hierarchical system including: building a model corresponding to each element of the hierarchical system; compiling a repository that contains the models corresponding to each element of the hierarchical system; and assembling a system model from the models contained in the repository; flattening the system model; and running a simulation on the flattened system model, wherein assembling the system model includes describing a connectivity of each of the elements of the hierarchical system, wherein the flattened system model is a resistor network, wherein SPICE is used to run the simulation on the flattened system model, and wherein the connectivity of each element is selected from one of the following: a connector of the element may be connected to another element; the connector of the element may be connected to another packaging element; or the connector of the element may be connected to a terminal.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution, which assembles a flattened model of a hierarchical system.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 2 illustrates an exemplary embodiment of a repository structure; and

FIG. 3 illustrates an exemplary embodiment of the structure of a description file.

Figure 1:
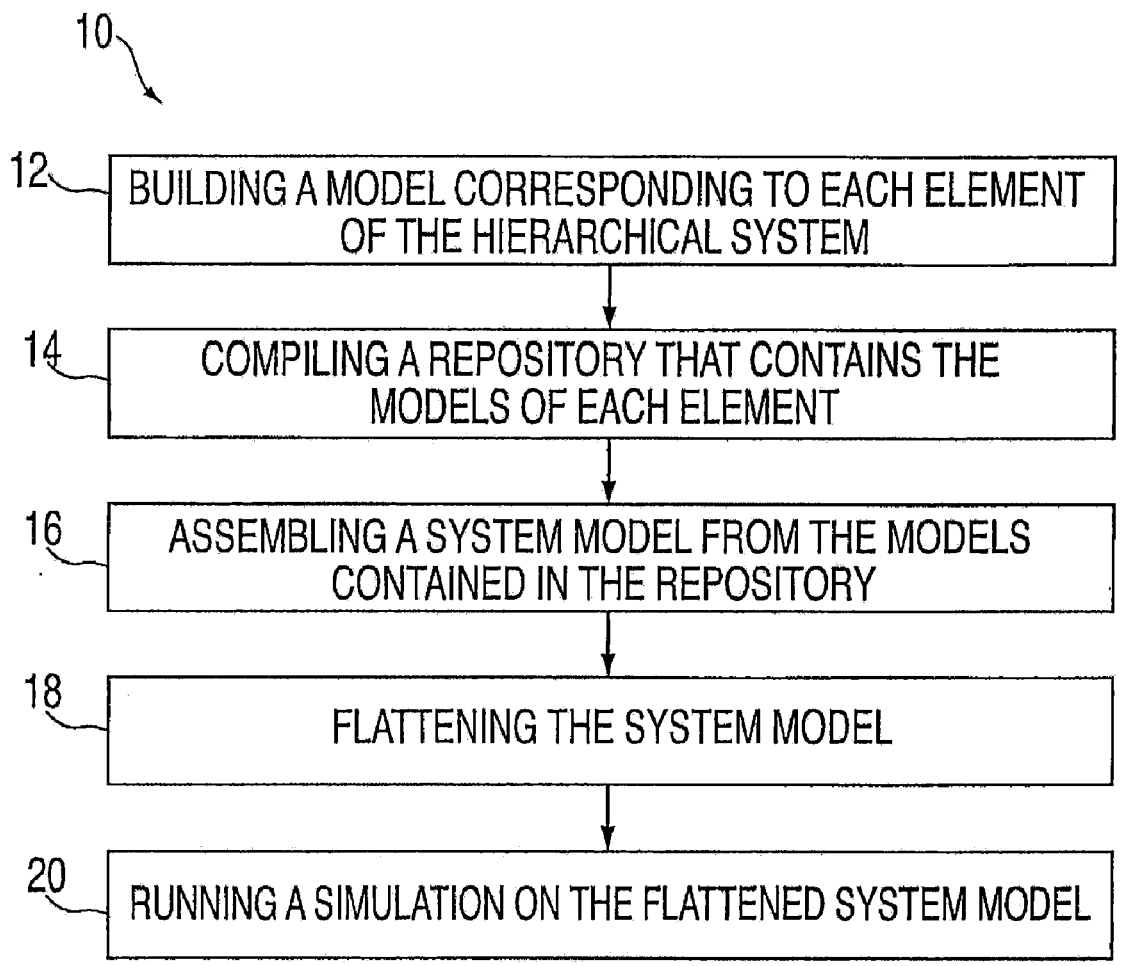
FIG. 1 illustrates a flow chart of an exemplary embodiment of a method of power delivery analysis and design in computer systems.

The detailed description explains the preferred embodiments of the invention, together with advantages and features, by way of example with reference to the drawings.

DETAILED DESCRIPTION

Referring now to FIG. 1, a flow chart of an exemplary embodiment of a method of power delivery analysis and design in computer systems is depicted generally as 10. The first step of the method 10 is to build a model for each element of the system, as shown at method block 12. The model of each element is built using a simulation tool and includes features that enable the connection of the element to a hierarchical system. In exemplary embodiments, the dimensions of the minimum feature size of the element are contained within each level of the packaging hierarchy, which greatly minimizes the required resources for the system. After modeling each element of the system, the method includes compiling a repository that contains the models of each element, as shown at method block 14. The repository allows for efficient reuse of the elements in a system model. Additionally, different levels of design completion are possible for the various elements. For example, the repository can contain various models for a single element (e.g., by modifying the connectivity of the model in an appropriate way).

Continuing with reference to FIG. 1, after compiling a repository of elements the method 10 includes assembling a system model, as depicted at method block 16. Assembling the system model includes describing the connectivity of each element in the system (e.g., for every element a file is created that describes for every connector on the board how it is connected to another element). For each connector there are two possible connection options the connector may be connected to another element or the connector may be connected to a terminal (e.g., a power supply or a chip). Once the system model has been assembled, the method 10 includes flattening the system model (e.g., changing the system model to a flat model consisting entirely of resistors, as shown at method block 18. The method concludes by running a simulation on the flattened system model, as shown at method block 20. The simulation may be performed in a wide variety of manners including the use of commercially available software such as HSPICE® (available from Avant! Corp. California), SPICE-3® (available from Berkeley University of California), SPECTRE® (available from Cadence Corp. of California), ACES® (Adaptively Controlled Engine Simulator), ITA® (Interactive Timing Analysis engine), or OLSEN.

In one embodiment each element of the system is modeled as a stand-alone model using a simulation. The stand-alone models for each element are then placed into the repository. Additionally, the stand-alone models may be modified to support the needs of the hierarchical approach (e.g., the models may be modified to enable the connection of the different elements).

Referring now to FIG. 2, an exemplary embodiment of a repository structure is generally depicted as 100. The repository structure 100 includes a net list 102, a domain list 104, a component list 106, a pin list 108, and a layer list 110. The net list 102 describes how the pins are connected to the power source(s). The domain list 104 is a list of all domain names for which the repository contains information. The component list 106 is a list of the components included in the repository. The pin list 108 is a list of each pin and its connectivity. The layer list 110 is a list of the layers in the system. For all elements with more than two connections a vcon file is created which describes the connectivity of each of the connections of the element. In addition an al-file that includes an actual model for each element is also created and stored in the repository.

In one embodiment, optimized gridding for each unit individually allows minimum problem size (e.g., the dimensions of the minimum feature size are contained with each level of the packaging hierarchy). For example, the GND repository of the chip-carrier has a size of approximately twenty megabytes and the extraction has been performed using the maximum allowed grid size. By reducing the grid size by fifty percent the model size would increase by four hundred percent. Therefore, the GND repository of the system-carrier has a size of approximately eighty megabytes, using the optimal gridding for the system board. If the system-board had be gridded with the same gridding as the chip-carrier, the model size would have been in excess of two gigabytes.

After the repository has been created for all packaging elements in the system the stand-alone models are assembled to build a flattened simulation model. The system is defined in the description file. An exemplary embodiment of the structure of a description file is generally depicted as 200. The description file 200 describes how the units are connected and terminated. The hierarchical assembler establishes interconnection of the elements, tracks net-names automatically, and adds terminations to the elements. In one embodiment, the description file 200 is the only file that the user has to create/modify and it defines the used repository, connectivity, and termination. In one embodiment, the description file can be generated with a GUI. In one embodiment the description file 200 contains a link to the systems resistor network, which is the internal model of the system. Additionally, the description file describes the connectivity and termination of the elements of the system (e.g., the termination information may be a connection to GNR or a chip model).

In one embodiment, two functions may be used to implement connectivity between packaging units. First, it may be required to track the domain name automatically because the same net on different designs may have different names. Second, the repository may provide information that allows the method to build an appropriate interconnection model.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A computer program product for power delivery analysis and design for a hierarchical system, the computer program product comprising:

a storage medium readable by a processing circuit and storing instructions for execution by the processing circuit for facilitating a method comprising:

building a model corresponding to each element of the hierarchical system;

compiling a repository that contains the models corresponding to each element of the hierarchical system, wherein the repository comprises a net list, a domain list, a component list, a pin list, and a layer list;

performing optimized gridding for each element of the hierarchical system, the net list, the domain list, the component list, the pin list, and the layer list;

assembling a system model from the models contained in the repository;

flattening the system model by converting the system model to a flattened system model that consists entirely of resistors; and running a simulation on the flattened system model.

2. The computer program product of claim 1, wherein the flattened system model includes one or more linear elements.

3. The computer program product of claim 2, wherein assembling the system model includes describing a connectivity of each of the elements of the hierarchical system.

4. The computer program product of claim 3, wherein the flattened system model is a resistor network.

5. The computer program product of claim 3, wherein SPICE is used to run the simulation on the flattened system model.

6. The computer program product of claim 3, wherein the connectivity of each element is selected from one of the following:

a connector of the element may be connected to another element; or the connector of the element may be connected to a terminal.

7. The computer program product of claim 3, wherein assembling the system model includes the use of a GUI to generate a description file.

8. The computer program product of claim 7, wherein description file includes a hierarchical description of the system model.

* * * * *